United States Patent
Nakamura et al.

(10) Patent No.: US 6,872,649 B2
(45) Date of Patent: Mar. 29, 2005

(54) METHOD OF MANUFACTURING TRANSPARENT CONDUCTOR FILM AND COMPOUND SEMICONDUCTOR LIGHT-EMITTING DEVICE WITH THE FILM

(75) Inventors: Takao Nakamura, Osaka (JP); Hideki Matsubara, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/224,930

(22) Filed: Aug. 20, 2002

(65) Prior Publication Data

US 2003/0166308 A1 Sep. 4, 2003

Related U.S. Application Data

(62) Division of application No. 09/519,408, filed on Mar. 3, 2000.

(30) Foreign Application Priority Data

Apr. 15, 1999 (JP) ............................ 11-107586
Jun. 28, 1999 (JP) ............................ 11-181414

(51) Int. Cl.$^7$ ............................ H01L 21/44
(52) U.S. Cl. .................. 438/608; 438/57; 438/662; 438/940; 427/585; 427/596
(58) Field of Search .................. 427/585, 596

(56) References Cited

U.S. PATENT DOCUMENTS

| | | | |
|---|---|---|---|
| 4,495,514 A | | 1/1985 | Lawrence et al. |
| 5,411,772 A | * | 5/1995 | Cheung ................ 427/586 |
| 5,617,446 A | | 4/1997 | Ishibashi et al. |
| 5,741,580 A | | 4/1998 | Hayamizu et al. |

(Continued)

FOREIGN PATENT DOCUMENTS

| | | |
|---|---|---|
| JP | 57 097686 | 6/1982 |
| JP | 57-106246 | 6/1982 |
| JP | 58 162076 | 9/1983 |
| JP | 05 136458 | 6/1993 |

(Continued)

OTHER PUBLICATIONS

Y. Fan et al.; "Graded band gap ohmic contact to p–ZnSe"; Appl. Phys. Lett. 61 (26), Dec. 28, 1992, 1992 American Institute of Physics, pp. 3160 to 3162.

E. Masetti et al.; "Analysis of the oxidation of polycrystalline zinc selenide by spectroscopic ellipsometry and photothermal deflection spectroscopy", Thin Solid Films, 234 (1993), pp. 557–560.

(Continued)

*Primary Examiner*—Long Pham
*Assistant Examiner*—Wai-Sing Louie
(74) *Attorney, Agent, or Firm*—W. F. Fasse; W. G. Fasse

(57) ABSTRACT

A light emitting-layer is provided on a substrate. A p-type semiconductor layer is provided on the light-emitting layer. An upper electrode is provided on the p-type semiconductor layer. The upper electrode includes an Au thin film coming into contact with the p-type semiconductor layer and an n-type transparent conductor film formed thereon. The n-type transparent conductor film is formed by laser ablation. Particularly, the method involves placing a substrate in a vacuum chamber, placing a target of the film material in the chamber, introducing oxygen into the chamber, laser-irradiating the target to emit atoms or molecular ions by ablation, and then depositing and oxidizing the atoms or ions to grow the transparent conductor film.

2 Claims, 12 Drawing Sheets

U.S. PATENT DOCUMENTS

| | | | |
|---|---|---|---|
| 5,990,500 A | * 11/1999 | Okazaki | 257/99 |
| 6,107,641 A | 8/2000 | Mei et al. | |
| 6,255,003 B1 | 7/2001 | Woodard et al. | |
| 6,271,460 B1 | 8/2001 | Yamashita et al. | |

FOREIGN PATENT DOCUMENTS

| | | | |
|---|---|---|---|
| JP | 05 139735 | 6/1993 | |
| JP | 05 283746 | 10/1993 | |
| JP | 6-508003 | 9/1994 | |
| JP | 06 283433 | 10/1994 | |
| JP | 06 318406 | 11/1994 | |
| JP | 08 102548 | 4/1996 | |
| JP | 09 059762 | 3/1997 | |
| JP | 09 232633 | 9/1997 | |
| JP | 10 012921 | 1/1998 | |
| JP | 10 074586 | 3/1998 | |
| JP | 10200163 | 7/1998 | |
| JP | 10 308534 | 11/1998 | |
| JP | 11 087772 | 3/1999 | |
| JP | 11-119238 | * 3/1999 | G02F/1/1343 |
| JP | 11 121804 | 4/1999 | |
| JP | 2000-44236 | 2/2000 | |
| JP | 2000 196152 | 7/2000 | |
| JP | 2000 299028 | 10/2000 | |
| WO | WO 92/21170 | 11/1992 | |

OTHER PUBLICATIONS $In_2O_3$–ZnO–based Amorphous Transparent Conductive Film (IDIXO) ; Display Monthly, and partial English translation thereof, Mar. 1998, pp. 15 to 20.

S. J. Pearton et al.; "Ion implantation doping and isolation of GaN", Appl. Phys. Lett. 67 (10) , 4. Sep. 1995, 1995 American Institutes of Physics, pp. 1435 to 1437.

J. B. Smathers et al.; "Nanometer scale surface clustering on ZnSe epilayers"; Applied Physics Letters, vol. 72, No. 10, Document 5, Mar. 9, 1998; pp. 1238 to 1240.

A. Waag et al.; "Novel beryllium containing II–VI compounds: basic properties and potential applications"; Journal of Crystal Growth 184/185 (1998), pp. 1 to 10.

Stephen J. Pearton; "GaN and Related Materials II", Gordon and Breach Science Publishers, 2000; pp. 52, 88.

* cited by examiner

METHOD OF MANUFACTURING TRANSPARENT CONDUCTOR FILM AND COMPOUND SEMICONDUCTOR LIGHT-EMITTING DEVICE WITH THE FILM

CROSS-REFERENCE TO RELATED APPLICATION

This application is a Divisional Application of copending application Ser. No. 09/519,408, filed Mar. 3, 2000.

BACKGROUND OF THE INVENTION

1. Field of the Invention

The present invention generally relates to a semiconductor light-emitting device, and more specifically, it relates to a semiconductor light-emitting device so improved that a large quantity of light is extractable. The present invention also relates to a method of manufacturing a transparent conductor film, and more specifically, it relates to a method of manufacturing a transparent conductor film improved to be smooth at a lower temperature and have low resistance and high transmittance so that the cost can be reduced. The present invention further relates to a method of manufacturing a compound semiconductor light-emitting device employing such a method.

2. Description of the Prior Art

FIGS. 9A and 9B illustrate the structure of a conventional light-emitting device and the light-emitting mechanism thereof. Referring to FIGS. 9A and 9B, a light-emitting diode (LED) is an electrical/optical conversion type semiconductor light emitting device utilizing minority carrier injection in a p-n junction part formed by p- and n-type semiconductor crystals adjacent to each other and subsequent recombination radiation.

The device itself is made of a semiconductor crystal material of about 0.3 mm square, and the basic structure thereof is similar to that of an Si rectifying device, as shown in FIG. 9A.

When applying positive and negative forward voltages to the p-type crystal and the n-type crystal respectively, electrons and holes are injected into a p region and an n region respectively, as shown in FIG. 9B. These minority carriers are partially recombined with majority carriers to emit light.

Such an LED has durability, long-livedness, a light weight and a miniature size. The LED, which has been applied only to an indoor indicator lamp, is now applied to the stop lamp of a car, a road sign, a traffic light, a large-area color display or the like following improvement of efficiency and brightness and reduction of the price. Now there is a possibility of applying the LED to the headlamp of a car or a house light substituting for a fluorescent lamp. Further, development of a high-efficiency LED is expected in consideration of energy saving.

Luminous efficiency of an LED includes external quantum efficiency and internal quantum efficiency, and the efficiency of the LED is proportional to the product thereof. The internal quantum efficiency is expressed in the ratio of the number of generated photons to the number of injected electron-hole pairs. In order to improve the internal quantum efficiency, it is necessary to obtain a high-quality crystal containing a small number of defects or impurities, in order to prevent recombination of the electron-hole pairs.

The external quantum efficiency is expressed in the ratio of the number of photons radiated outward to the number of the injected electron-hole pairs. Light generated from an active layer is absorbed by the active layer itself, a substrate or an electrode, and hence can be only partially extracted into air. Further, the refractive index of the semiconductor is by far higher than that of the outside and hence most part of the light is totally reflected by the boundary between the semiconductor and the outside and returned into the semiconductor. Most of LEDs now on the market are sealed with epoxy resin having a refractive index of 1.5, in order to increase the critical angle of total reflection for extracting a larger quantity of light, in addition to the purposes of protection and anti-oxidation of the LEDs.

FIG. 10 is a conceptual diagram showing the structure of a conventional LED. An active layer 23 is formed on an n-type semiconductor layer 22 having an n electrode 21 on the back surface. A p-type semiconductor layer 24 is formed on the active layer 23. A p electrode 25 is formed on the p-type semiconductor layer 24. Recombination radiation occurs at the maximum immediately under an electrode in which a current flows at the maximum. However, a general electrode blocks light, and hence it follows that light emitted immediately under the electrode is hardly extracted outward. In this case, it is important to spread the current to a region other than the electrode. Therefore, a current diffusion layer is provided or a thin gold electrode transmitting light is provided on the overall surface.

FIG. 11 is a sectional view of an LED having a current diffusion electrode 26 provided on a p-type semiconductor layer 24. The current diffusion electrode 26 is formed by an Au thin film of about 20 nm in thickness, in order to obtain sufficient current spreading.

However, the transmittance of the Au thin film 26 having this thickness is only 37% for light of 500 nm in wavelength. Thus, most part of the light is absorbed, to result in inferior luminous efficiency.

Problems of a transparent conductor film applied to a conventional compound semiconductor light-emitting device are now described. The transparent conductor film applied to the conventional compound semiconductor light-emitting device is generally prepared from ITO ($In_2O_3$-5 wt. % $SnO_2$). Sputtering is mainly employed for forming a film of ITO having transmittance of at least 80% and resistivity of about $2 \times 10^{-4}$ $\Omega$cm at a substrate temperature of 300° C. with excellent reproducibility. In consideration of application to organic electroluminescence (EL) or a light-emitting diode (LED), a transparent conductor film formable at a lower temperature is demanded.

Japanese Patent Laying-Open No. 6-318406 (1994) proposes a technique of manufacturing a film of $In_2O_3$-10 wt. % ZnO capable of implementing high transmittance and low resistivity at the room temperature. According to this technique, a film of 140 nm in thickness formed by sputtering under the room temperature implements resistivity of $3 \times 10^{-4}$ $\Omega$cm and transmittance of 86% (at 550 nm).

Further, study is made on formation of a transparent conductor film by vapor deposition or ion plating.

The transmittance and conductivity of a transparent conductor film remarkably depend on the amount of oxygen. In the conventional vapor deposition, however, the film forming pressure is disadvantageously limited due to running of a vapor deposition source. In the sputtering, the pressure and the gas for forming a film are limited such that the pressure range is limited for utilizing plasma and argon is required for forming the plasma, and hence the amount of oxygen cannot be precisely controlled.

SUMMARY OF THE INVENTION

The present invention has been proposed in order to solve the aforementioned problems, and an object thereof is to provide a semiconductor light-emitting device improved to be capable of increasing luminous efficiency.

Another object of the present invention is to provide a method of manufacturing a transparent conductor film improved to be capable of precisely controlling the amount of oxygen with no limitation of the film forming pressure and the film forming gas.

Still another object of the present invention is to provide a method of manufacturing a transparent conductor film improved to be capable of improving transmittance and reducing the cost.

A further object of the present invention is to provide a method of manufacturing a compound semiconductor light-emitting device including a step of forming a transparent conductor film improved to be capable of improving transmittance and reducing the cost.

A semiconductor light-emitting device according to a first aspect of the present invention comprises a substrate provided with an n-type lower electrode on the back surface. A light-emitting layer is provided on the aforementioned substrate. A p-type semiconductor layer is provided on the aforementioned light-emitting layer. An upper electrode is provided on the aforementioned p-type semiconductor layer. The aforementioned upper electrode has a multilayer structure consisting of at least two heterogeneous layers.

According to this aspect, the upper electrode is formed by the multilayer structure consisting of at least two heterogeneous layers, whereby an upper electrode forming no junction with the p-type semiconductor layer and having high transmittance can be formed by properly selecting the heterogeneous layers. Thus, a semiconductor light-emitting diode having high luminous efficiency can be obtained.

According to a second aspect of the present invention, the aforementioned upper electrode includes an Au thin film coming into contact with the aforementioned p-type semiconductor layer and an n-type transparent conductor film formed thereon.

The transparent conductor film, generally prepared from an n-type semiconductor, inevitably forms a junction when the same is directly formed on the p-type semiconductor layer. In order to avoid this, an extremely thin Au film is formed on the p-type semiconductor layer, and the transparent conductor film is thereafter stacked thereon. When the thickness of the Au thin film is reduced, the transmittance is not remarkably reduced. The transparent conductor film having high transmittance can be formed in a relatively large thickness. Consequently, a current effectively spreads over the electrode through the transparent conductor film.

According to a third aspect of the present invention, the thickness of the aforementioned Au thin film is 1 nm to 3 nm. The thickness of the Au film is so sufficiently small that the transmittance is not remarkably reduced.

According to a fourth aspect of the present invention, the aforementioned transparent conductor film is made of $In_2O_3$-10 wt. % ZnO. The transmittance is increased when preparing the transparent conductor film from such a material.

According to a fifth aspect of the present invention, the aforementioned upper electrode has a multilayer structure including an upper layer and a lower layer. The surface of the aforementioned lower layer is flattened. The surface of the aforementioned upper layer is irregularized.

According to this aspect, light, which is unextractable due to total reflection when the surface is smooth, can be effectively extracted outward by irregularly controlling the surface shape of the transparent conductor film. Consequently, optical output can be improved.

According to a sixth aspect of the present invention, the aforementioned substrate includes a ZnSe single-crystalline substrate. The aforementioned p-type semiconductor layer includes a ZnSe semiconductor layer, a ZnTe semiconductor layer or a BeTe semiconductor layer.

According to a seventh aspect of the present invention, the aforementioned transparent conductor film of $In_2O_3$-10 wt. % ZnO is formed by laser ablation.

In a method of manufacturing a transparent conductor film according to an eighth aspect of the present invention, a substrate is first placed in a vacuum chamber. A target serving as the material for a transparent conductor film is centered in the aforementioned vacuum chamber. Oxygen is introduced into the aforementioned vacuum chamber. The aforementioned target is irradiated with a laser beam, for depositing atoms or molecular ions emitted by ablation on the aforementioned substrate and crystal-growing the atoms or molecular ions while oxidizing the same.

This method, referred to as laser ablation, is employed for forming a transparent conductor film in the present invention. In the laser ablation, an excimer laser beam serving as an excitation source is guided from outside a film forming apparatus, not to limit the film forming pressure and the film forming gas. Further, the laser ablation involves no influence by reverse sputtering caused by negative ions, dissimilarly to sputtering. According to the laser ablation, the amount of oxygen can be readily controlled and a film having a composition close to that of the target can be obtained due to the aforementioned characteristics. Further, it is possible to obtain a film having superior surface smoothness as compared with that formed by sputtering.

According to a ninth aspect of the present invention, $In_2O_3$-10 wt. % ZnO is employed for the aforementioned target.

A method of manufacturing a transparent conductor film according to a tenth aspect of the present invention is carried out at a film forming temperature in the range of the room temperature (RT) to 300° C.

A method of manufacturing a transparent conductor film according to an eleventh aspect of the present invention is carried out at a film forming pressure of 0.3 to $3 \times 10^{-3}$ Torr.

In a method of manufacturing a compound semiconductor light-emitting device according to a twelfth aspect of the present invention, a compound semiconductor light-emitting device substrate immediately before formation of a transparent electrode is first prepared. The aforementioned compound semiconductor light-emitting device substrate is placed in a vacuum chamber. A target serving as the material for a transparent conductor film is centered in the aforementioned vacuum chamber. Oxygen is introduced into the aforementioned vacuum chamber. The aforementioned target is irradiated with a laser beam, for crystal-growing the aforementioned transparent electrode while depositing atoms or molecular ions emitted by ablation on the aforementioned substrate and oxidizing the same.

According to this aspect, the transparent electrode is formed on the compound semiconductor light-emitting device substrate by laser ablation, whereby a compound semiconductor light-emitting device having low resistance and improved transmittance is obtained.

According to a thirteenth aspect of the present invention, $In_2O_3$-10 wt. % ZnO is employed as the aforementioned target.

A method of manufacturing a compound semiconductor light-emitting device according to a fourteenth aspect of the present invention is carried out at a film forming temperature in the range of the room temperature (RT) to 300° C.

A method of manufacturing a compound semiconductor light-emitting device according to a fifteenth aspect of the present invention is carried out at a film forming pressure of 0.3 to $3 \times 10^{-3}$ Torr.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1A, 1B, 1C and 1D illustrate the structure of a semiconductor light-emitting device according to a first embodiment of the present invention and certain comparative features thereof;

DESCRIPTION OF THE PREFERRED EMBODIMENTS

First Embodiment

Figure 1A:
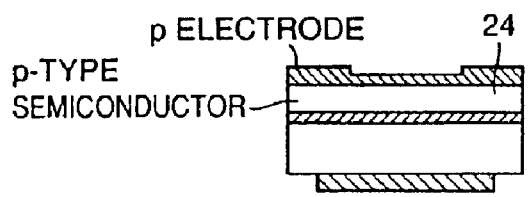
Figure 1A:
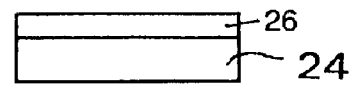
Figure 1A:
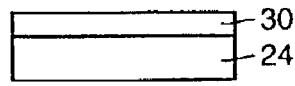
Figure 1A:
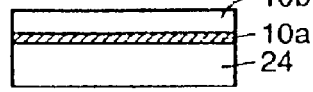

In a first embodiment of the present invention, a transparent conductor film having low resistance and high transmittance is employed in place of a conventional Au film. Referring to FIG. 1A, the transparent conductor film is applied as a p-type electrode in the first embodiment of the present invention in particular.

Referring to comparative FIG. 1C, a transparent conductor film 30 generally consists of an n-type semiconductor, and inevitably forms a junction when directly formed on a p-type semiconductor layer 24. Referring to comparative FIG. 1B, transmittance as well as luminous efficiency are reduced when a relatively thick Au film 26 is formed on a p-type semiconductor layer 24.

Referring to FIG. 1D, an extremely thin Au thin film 10a is formed on a p-type semiconductor layer 24, and a transparent conductor film 10b is thereafter stacked thereon according to the present invention. The Au thin film 10a has a sufficiently small thickness of 1 to 3 nm, so that the transmittance is not remarkably reduced. The transparent conductor film 10b having high transmittance can be formed with a relatively large thickness. Consequently, a current effectively spreads over an electrode through the transparent conductor film 10b.

Figure 2:
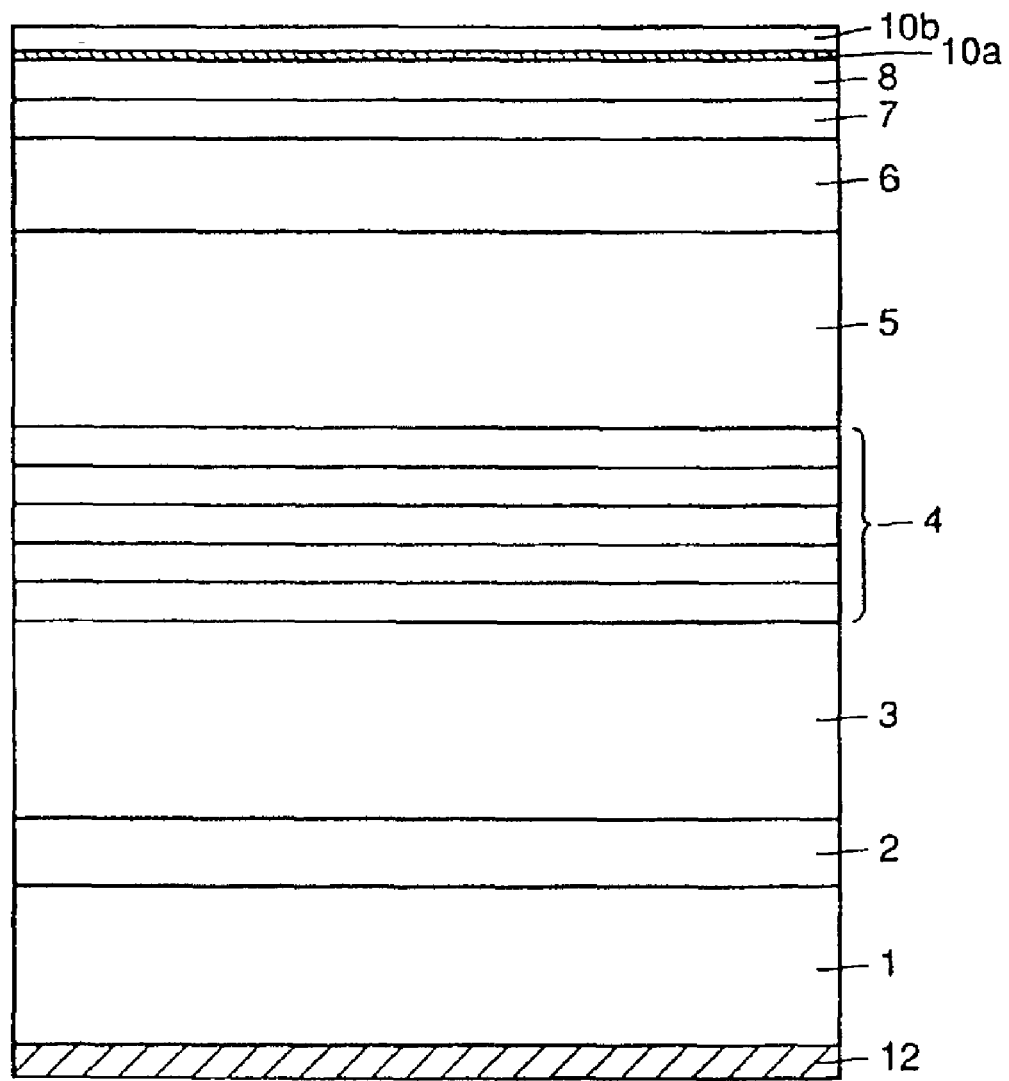
FIG. 2 is a sectional view of a specific example of the semiconductor light-emitting device according to the first embodiment.

FIG. 2 is a sectional view of a ZnSe compound semiconductor light-emitting device to which the present invention is applied. An n-type ZnSe buffer layer 2 of 1 µm in thickness, an n-type ZnMgSSe clad layer 3 of 1 µm in thickness, a ZnSe/ZnCdSe multiple quantum well active layer 4, a p-type ZnMgSSe clad layer 5 of 1 µm in thickness, a p-type ZnSe layer 6 of 0.2 µm in thickness and a p-type contact layer 7 consisting of a multilayer superlattice structure of ZnTe and ZnSe are successively provided on a conductive ZnSe single-crystalline substrate 1 having an n-type electrode 12 on the back surface. A p-type ZnTe layer 8 of 60 nm in thickness is provided on the uppermost surface. An upper electrode 10 having a multilayer structure of an Au thin film 10a of 1 to 3 nm in thickness and a transparent conductor film 10b formed thereon is formed on such an epi-structure.

Second Embodiment

Figure 3:
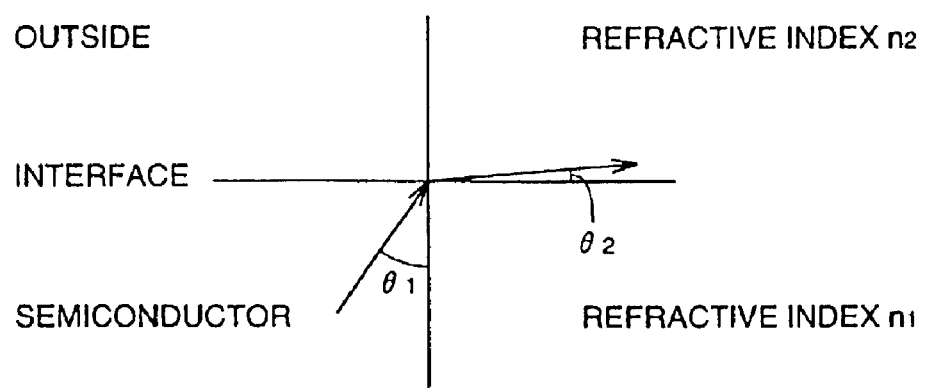
FIG. 3 is a conceptual diagram for illustrating improvement of optical output in a semiconductor light-emitting diode according to a second embodiment of the present invention.

A second embodiment of the present invention relates to a technique of extracting light, which is unextractable due to total reflection, by (e.g., irregularly) controlling the surface shape of a transparent conductor film. Thus, optical output can be improved. FIG. 3 illustrates the concept of this embodiment.

The following equation holds according to the Snell's law:

$$n_1 \sin \theta_1 = n_2 \sin \theta_2$$

Assuming that $n_1 = 3.5$ (semiconductor) and $n_2 = 1$ (air), an angle $\theta_1$ equalizing an angle $\theta_2$ with 90° is 16.6° (critical angle). In this case, therefore, light is only partially extractable outward.

The critical angle can be increased by preparing the surface of the transparent conductor film in the form of a lens or a saw. Thus, light unextractable due to total reflection can be extracted outward and optical output can be improved.

According to the present invention, as hereinabove described, the transmittance of an electrode is increased and optical output is improved when a p-type electrode is formed by a transparent conductor film and an Au film. Further, the life is increased under constant output due to the improvement of the optical output. The surface shape of the transparent conductor film can be controlled due to the high transmittance thereof. Consequently, the optical output can be improved. In addition, the thickness of the transparent conductor film can be increased due to the high transmittance, and the surface shape thereof can be readily controlled.

The present invention is now more specifically described.

The following Examples were directed to LEDs of ZnSe, and $In_2O_3$-10 wt. % ZnO was employed as the material for transparent conductor films.

EXAMPLE 1

In each sample, an LED having an active layer of ZnCdSe was formed on an n-type ZnSe(100) substrate prepared by CVT (chemical vapor transport). A p-type electrode was set in a p-type ZnSe/ZnTe superlattice structure. An Au film of 3 nm in thickness was formed thereon by vacuum deposition, and a film of $In_2O_3/10$ wt. % ZnO (IDIXO) was thereafter formed by laser ablation under the following conditions:

Film Forming Temperature: room temperature (25° C.)
Film Forming Pressure: $3 \times 10^{-3}$ $TorrO_2$
Laser: KrF laser of 248 nm and 2 $J/cm^2$ Table 1 shows the relation between electrode structures, voltages and optical output values (in energization at 20 mA).

TABLE 1

| Electrode Structure | Voltage | Optical Output |
| --- | --- | --- |
| 20 nm Au | 2.88 V | 1.31 mW |
| IDIXO(90 nm)/Au(3 nm) | 2.84 V | 1.91 mW |
| IDIXO(180 nm)/Au(3 nm) | 2.79 V | 2.19 mW |
| IDIXO(190 nm) | 3.39 V | 2.21 mW |

In the sample having the electrode structure of IDIXO (180 nm)/Au (3 nm), the optical output was increased from 1.31 mW to 2.19 mW, i.e., by 1.67 times, as compared with the conventional sample having the electrode structure of Au (20 nm). The operating voltage remained substantially unchanged. In the sample having the electrode structure of IDIXO (190 nm), the optical output was substantially identical to that of the sample having the electrode structure of IDIXO (180 nm)/Au (3 nm) while the operating voltage was increased. Thus, it is understood that the film of Au (3 nm) suppressed formation of a junction.

In the sample having the electrode structure of IDIXO (90 nm)/Au (3 nm), the optical output was reduced as compared with the sample having the electrode structure of IDIXO (180 nm)/Au (3 nm). This conceivably resulted from reduction of transmittance caused by multiple reflection in the film of IDIXO. As a result of an experiment, it has been proved that an electrode structure of IDIXO (180 nm to 200 nm)/Au (2 nm to 3 nm) brings an excellent result.

The thickness maximizing the transmittance is expressed as $(1/4 + m/2) \times \lambda/n$ (m=0, 1, 2, 3), and the thickness minimizing the transmittance is expressed as $(m/2) \times (\lambda/n)$, where $\lambda$ represents the emission wavelength and n represents the refractive index of the IDIXO film.

When the emission wavelength of an LED is 480 nm, for example, the actual value of the refractive index n is 2.07. Therefore, the thickness maximizing the transmittance is 58 nm (m=0) or 174 nm (m=1), i.e., substantially identical to the aforementioned thickness of 180 nm. The thickness minimizing the transmittance is 116 nm (m=1).

EXAMPLE 2

After depositing an Au film, a film of $In_2O_3/10$ wt. % ZnO was continuously formed in two stages as shown in Table 2. The surface of the upper layer was irregularized.

TABLE 2

| | Film Forming Temperature | Thickness | Film Forming Pressure | Surface Shape |
| --- | --- | --- | --- | --- |
| Lower Layer | Room Temperature | 180 nm | $3 \times 10^{-3}$ Torr | smooth |
| Upper Layer | Room Temperature | 180 nm | $3 \times 10^{-1}$ Torr | irregular |

In this sample, the operating voltage was 2.80 V, and the optical output was increased to 2.43 mW.

Third Embodiment

Figure 4:
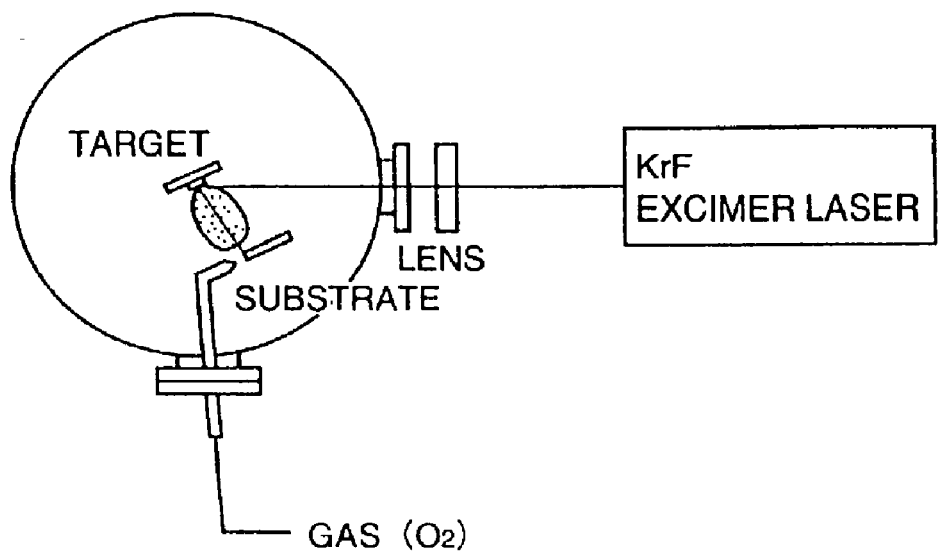
FIG. 4 is a conceptual diagram of a laser ablation film forming apparatus.

FIG. 4 is a conceptual diagram of a laser ablation apparatus employed for a method of manufacturing a transparent conductor film according to the present invention. A method irradiating a solid surface with a high-density laser pulse, depositing ions or atoms emitted therefrom on a substrate located on an opposite position and forming a thin film is referred to as laser ablation. This method is remarkably suitable for a process of forming a metal oxide derivative thin film. According to laser ablation, not only film formation but also refinement, etching, multi-layering etc. can be performed in the same experimental chamber with a strong laser pulse. In relation to formation of a ferroelectric thin film, laser ablation has the following advantages:

First, a laser beam is introduced from outside a film forming chamber in this method, and hence a thin film can be formed in an arbitrary atmosphere pressure suitable for crystal growth. Further, atoms, molecules and ions are emitted only from a target, and hence a thin film containing no impurities is formed.

Various parameters such as a pressure, a substrate temperature and a film forming rate can be individually selected. As to controllability of the thin film, film formation can be instantaneously controlled by adjusting the number of laser pulses and energy.

In addition, the film can be formed at an extremely high rate, as recently clarified. Thus, laser ablation has a number of excellent points.

In the laser ablation apparatus, a bulk target consisting of a ferroelectric substance for forming a film is centered in a vacuum chamber, oxygen or gas such as ozone or $NO_2$ having strong oxidizing power is introduced into the vacuum system and the target is irradiated with a pulse laser beam for causing ablation. Atoms, molecules and ions emitted by ablation are deposited on the substrate and oxidized to cause crystal growth. In a third embodiment of the present invention, a transparent conductor film was formed in such a laser ablation apparatus.

Film forming conditions are as follows:
Laser: KrF laser of 248 nm and 2 $J/cm^2$
Target: $In_2O_3$-10 wt. % ZnO (high-density product by Idemitsu Kosan, hereinafter abbreviated as IDIXO)
Substrate: MgO (for measuring transmittance) and glass (for measuring resistivity)
Film Forming Temperature: in the range of the room temperature (RT) to 300° C., the room temperature was employed as the standard
Film Forming Pressure: 0.3 to $3 \times 10^{-3}$ $TorrO_2$, $3 \times 10^{-3}$ $TorrO_2$ was employed as the standard The film forming conditions are described in more detail.
Oxygen Pressure Dependency Oxygen pressure dependency of the transmittance of the transparent conductor film was first investigated.

In laser ablation, a plume shape varies with the film forming pressure. Under a certain film forming pressure, the composition of a sample varies with the part of the plume on which the sample is located. The inventor has obtained such a result that the optimum target-to-substrate distance is about 60 to 70 mm in development of a superconducting device, and this time the target-to-substrate distance was fixed to 70 mm from observation of the plume, for evaluating the oxygen pressure dependency. The thickness of the IDIXO film was set to about 120 nm.

Figure 5:
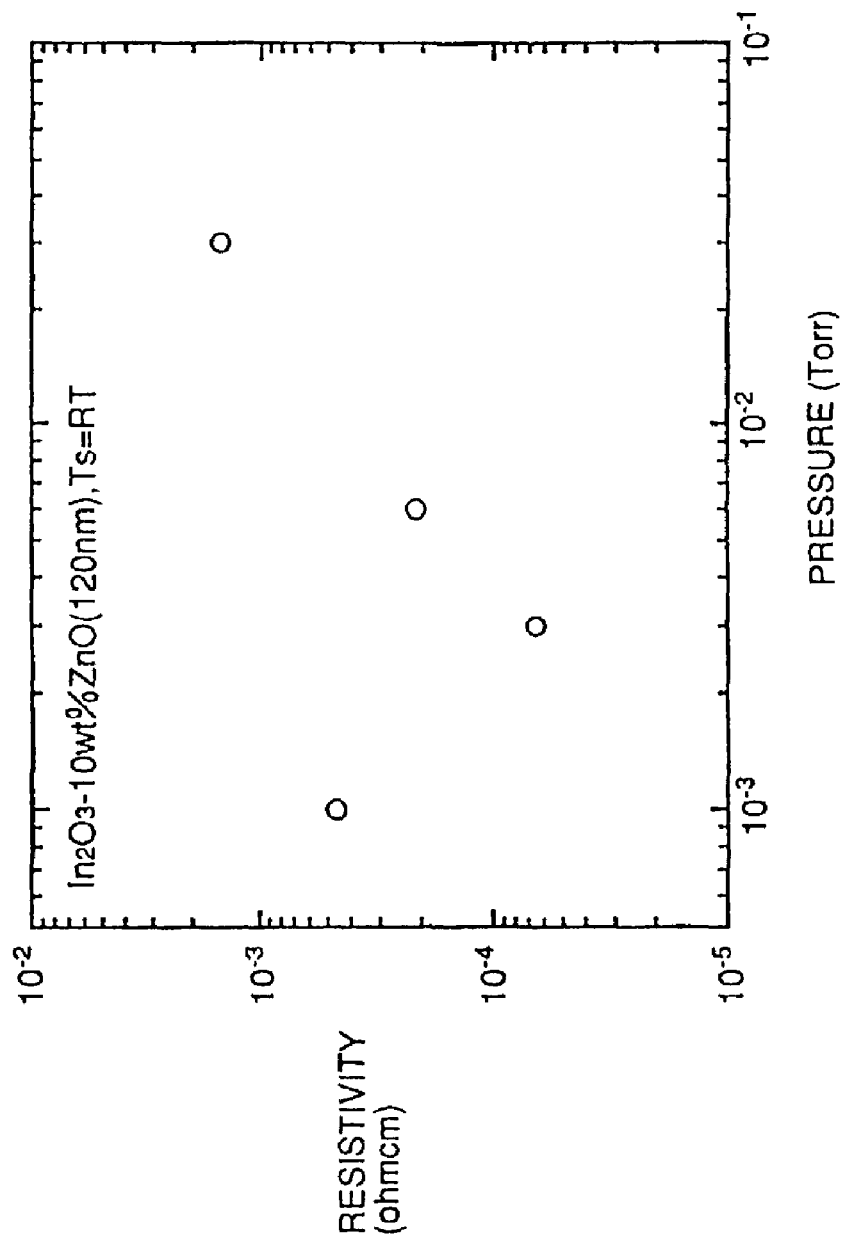
FIG. 5 illustrates the relation between resistivity of an IDIXO film having a thickness of 120 nm and oxygen pressure.

FIG. 5 shows the relation between resistivity and oxygen pressure. The resistivity remarkably varied with the oxygen pressure, and a characteristic having a dip was obtained at $3\times10^{-3}$ Torr. This agrees with the hitherto report that the resistance of a transparent conductor film has an optimum value depending on the amount of oxygen. It is extremely difficult to obtain the lowest value of $6.5\times10^{-5}$ Ωcm by conventional sputtering. Thus, the resistivity is lower by about one figure as compared with sputtering, and hence the necessary thickness can be reduced to 1/10, the transmittance can be increased and a high-quality transparent conductor film can be prepared at a low cost. The surface of the film prepared under these conditions was extremely smooth with roughness of about 0.5 nm. This value is about 1/10 that of a film prepared by sputtering.

Figure 6A:
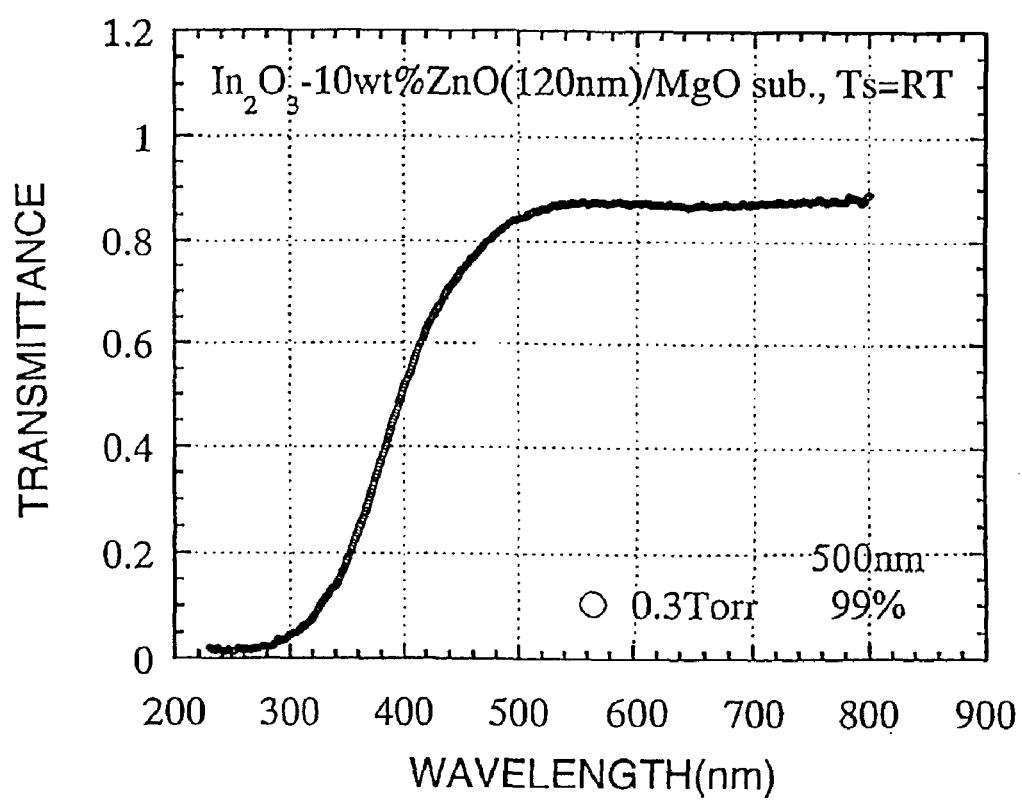
FIGS. 6A, 6B and 6C illustrate the oxygen pressure dependency of transmittance of the IDIXO film having a thickness of 120 nm, by showing the transmittance characteristic at three different pressures.
Figure 6B:
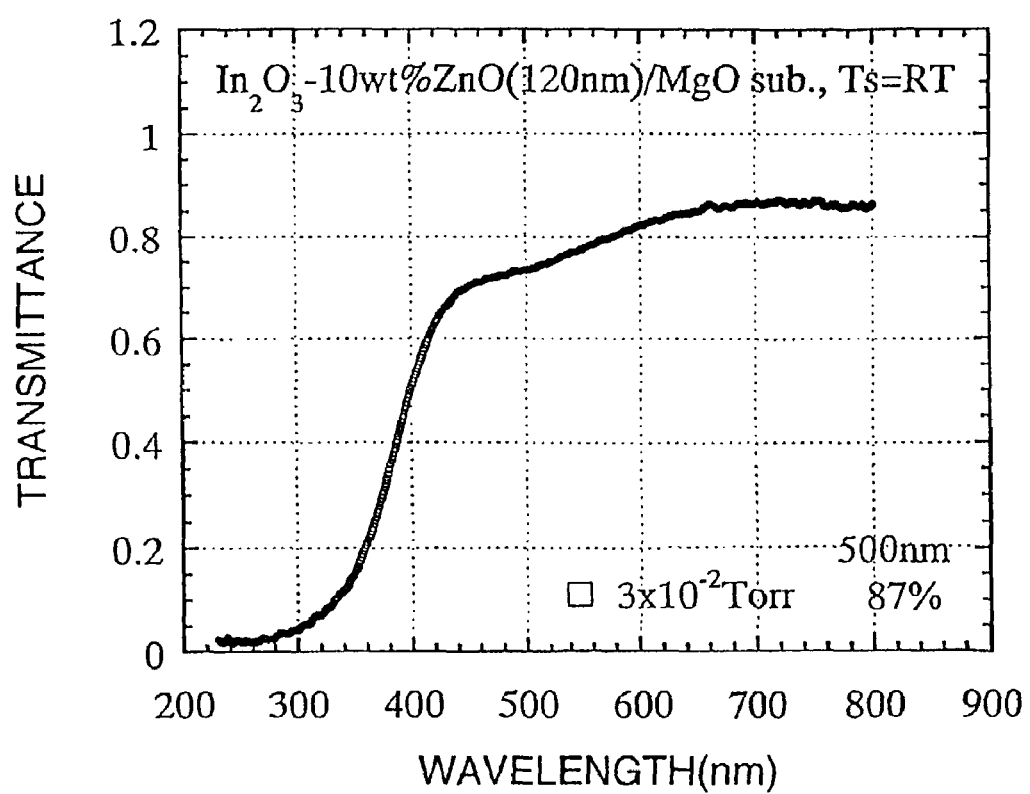
Figure 6C:
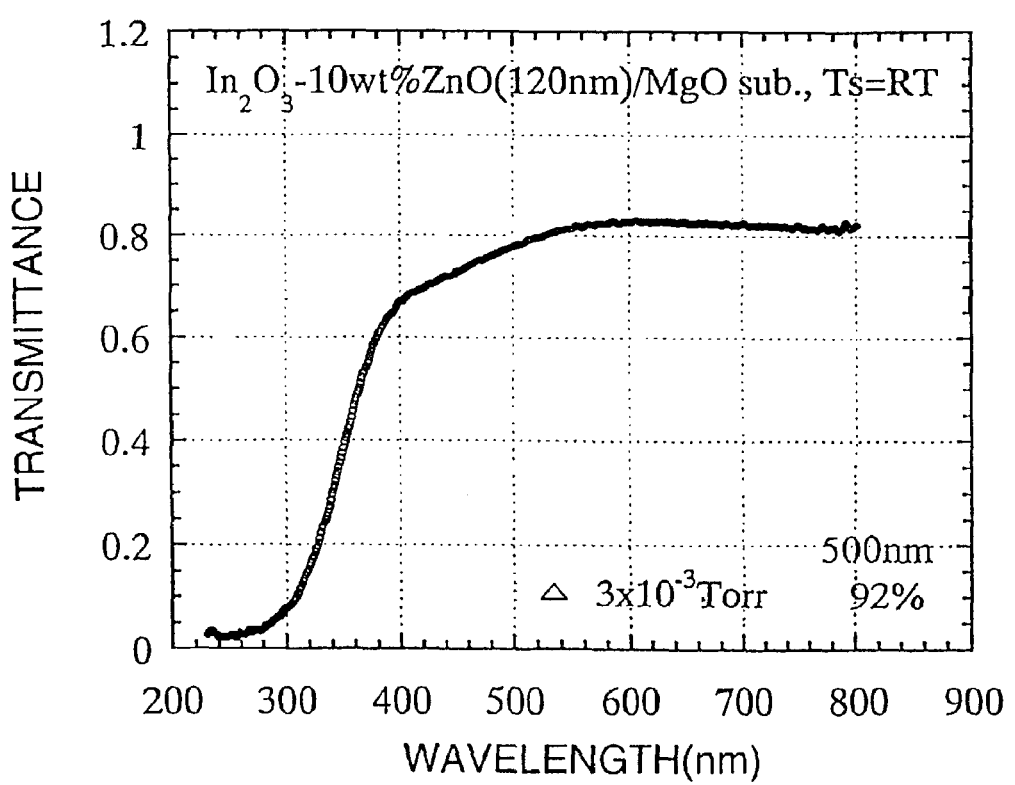

FIGS. 6A, 6B, and 6C show results of evaluation of the oxygen pressure dependency of transmittance of IDIXO films on substrates of MgO, respectively for three different film forming oxygen pressures. An absorption edge of about 300 nm is recognized. The sample for measuring transmittance was formed by a substrate of MgO having an absorption edge of about 200 nm, and it is understood that absorption of 300 nm results from the IDIXO film. The transmittance of the MgO substrate measured at a wavelength of 500 nm was 84%, and the relation between the film forming oxygen pressure and the transmittance of tile IDIXO film (120 nm) can be calculated as shown in table 3.

TABLE 3

| Film Forming Oxygen Pressure | IDIXO Transmittance |
|---|---|
| 0.3 Torr | 99% |
| $3\times10^{-2}$ Torr | 87% |
| $3\times10^{-3}$ Torr | 92% |

At the film forming pressure of 0.3 Torr, the resistivity is extremely increased although high transmittance is obtained. At the film forming pressure of $3\times10^{-3}$ Torr providing the lowest resistivity, transmittance of 92% was obtained. In a light-emitting device, an Au film having a small thickness is generally used as a transparent electrode. The transmittance of an Au film having a thickness of 20 nm is 37%, and hence optical output exceeding twice that of a general light-emitting device can be obtained by employing an IDIXO film.

Reproducibility

When applying IDIXO to a product, 1) in-plane distribution, 2) reproducibility and the like must be evaluated. A ZnSe substrate, which is about 10 mm square at present, is regarded as non-problematic in consideration of experiments and achievements made by the inventor in relation to plume shapes and superconduction. This time change of resistivity was evaluated on samples of an IDIXO film formed three times under the same conditions. Table 4 shows the results.

TABLE 4

| Run No. | IDIXO Resistivity |
|---|---|
| 1 | $3.5\times10^{-5}$ Ωcm |
| 2 | $4.5\times10^{-5}$ Ωcm |
| 3 | $5.7\times10^{-5}$ Ωcm |

While increase of the resistivity is recognized along the run, values of not more than $10^{-5}$Ωcm were obtained in all samples. Stability at such low values is regarded as non-problematic in application to a product.

Conceivable factors for such change of the resistivity are 1) change of the target composition and 2) change of the film thickness. The change 1) can be prevented by polishing the surface of the target and the change 2) can be prevented by setting a thickness monitor.

Oxygen Pressure Dependency in Temperature Reduction

When forming an IDIXO film by laser ablation, the resistivity can be reduced by about one figure in best data as compared with the conventional sputtering. This shows such a possibility that the thickness of a transparent conductor film employed in general can be reduced to about 1/10. In vapor deposition or sputtering, an excitation source (heat in vapor deposition or plasma in sputtering) is present in an apparatus to limit film forming conditions. In contrast with this, an excimer laser beam serving as an excitation source is introduced from outside the apparatus in laser ablation, and hence the film forming pressure can be readily changed from a level close to the atmospheric pressure up to a high vacuum, to enable film formation under the optimum oxygen pressure. Also as to the film composition, a film having a composition close to the target composition can be readily obtained in laser ablation. For such reasons, it is conceivable that formation of an IDIXO film having extremely high resistivity can be implemented according to the present invention.

In order to study the relation between the amount of oxygen and the resistivity, an experiment of changing a temperature reduction atmosphere after film formation was performed at about 300° C. The film forming pressure was set at the value of $3\times10^{-3}$ Torr bringing the lowest resistivity in film formation at the room temperature. Table 5 shows the results.

TABLE 5

| Temperature Reduction Condition | Resistivity |
|---|---|
| 100 Torr $O_2$ | $5.2\times10^{-2}$ Ωcm |
| $3\times10^{-3}$ Torr (film forming pressure) | $2.3\times10^{-3}$ Ωcm |
| in vacuo | $1.4\times10^{-3}$ Ωcm |

When the temperature was lowered under 100 Torr, oxygen was supplied to the sample to increase the resistivity. When the temperature was reduced under the film forming pressure or in vacuo, the resistivity remained substantially unchanged, to prove that the introduced oxygen is not extremely changed in this temperature range. Also in consideration of the experiment on oxygen pressure dependency, it is conceivable that the IDIXO film facilitates introduction of oxygen, and is hard to damage.

Evaluation of IDIXO Film provided with Au Film

A transparent conductor film, which consists of an n-type semiconductor in general, has a possibility of forming a junction when formed as a p electrode of a ZnSe LED. In order to avoid this, an IDIXO/Au structure obtained by forming an Au film before forming an IDIXO film was studied. Table 6 shows results in relation to resistivity.

TABLE 6

| Thickness of Au Film | Resistivity |
|---|---|
| 3 nm | $1.2\times10^{-4}$ Ωcm |
| 10 nm | $6.0\times10^{-5}$ Ωcm |

As compared with a smooth glass substrate, slightly higher resistivity was obtained when the thickness of the Au film was 3 nm, and substantially identical resistivity was obtained when the thickness was 10 nm. When the thickness of the Au film was 3 nm, the resistivity was increased conceivably because no continuous film of IDIXO was grown in an initial stage due to the presence of Au (not contributing to electrical conduction) grown in the form of an island. When the thickness of the Au film was 10 nm, Au formed a continuous film to compensate for reduction of electrical conduction of IDIXO.

Figure 7A:
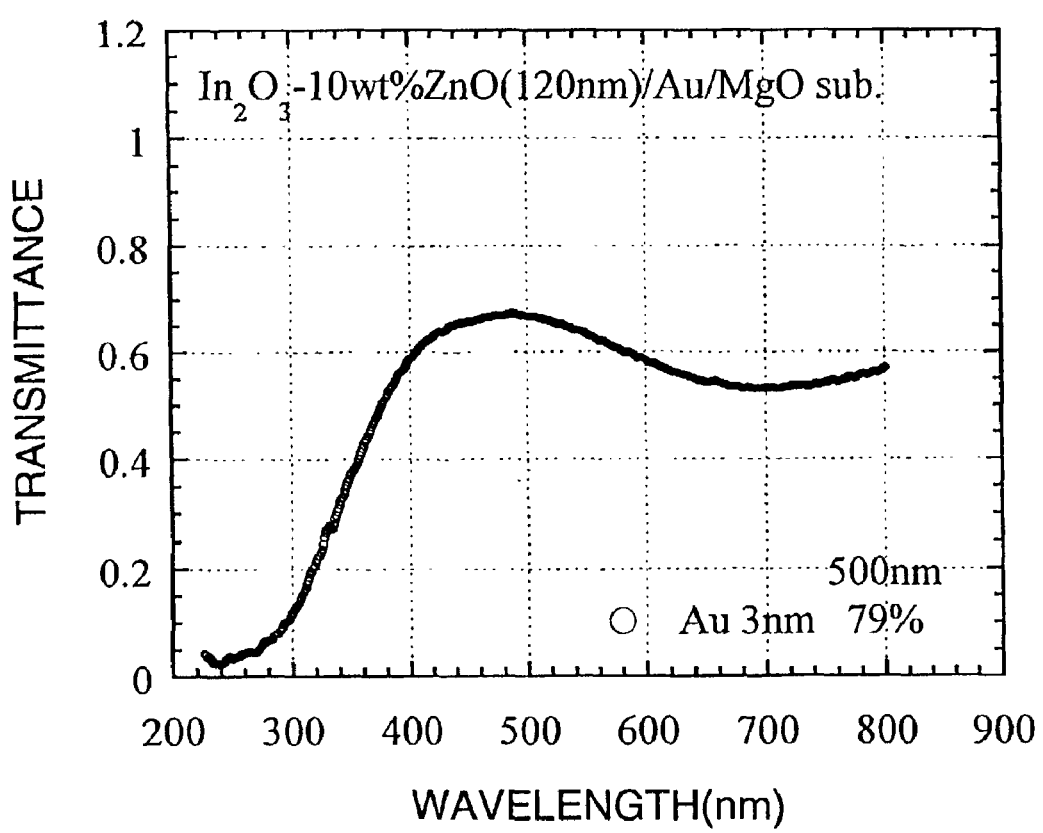
FIGS. 7A, 7B and 7C illustrate the dependency of transmittance of IDIXO (120 nm)/Au with respect to the film thickness of the Au film by showing the transmittance characteristic at three different Au film thicknesses.
Figure 7B:
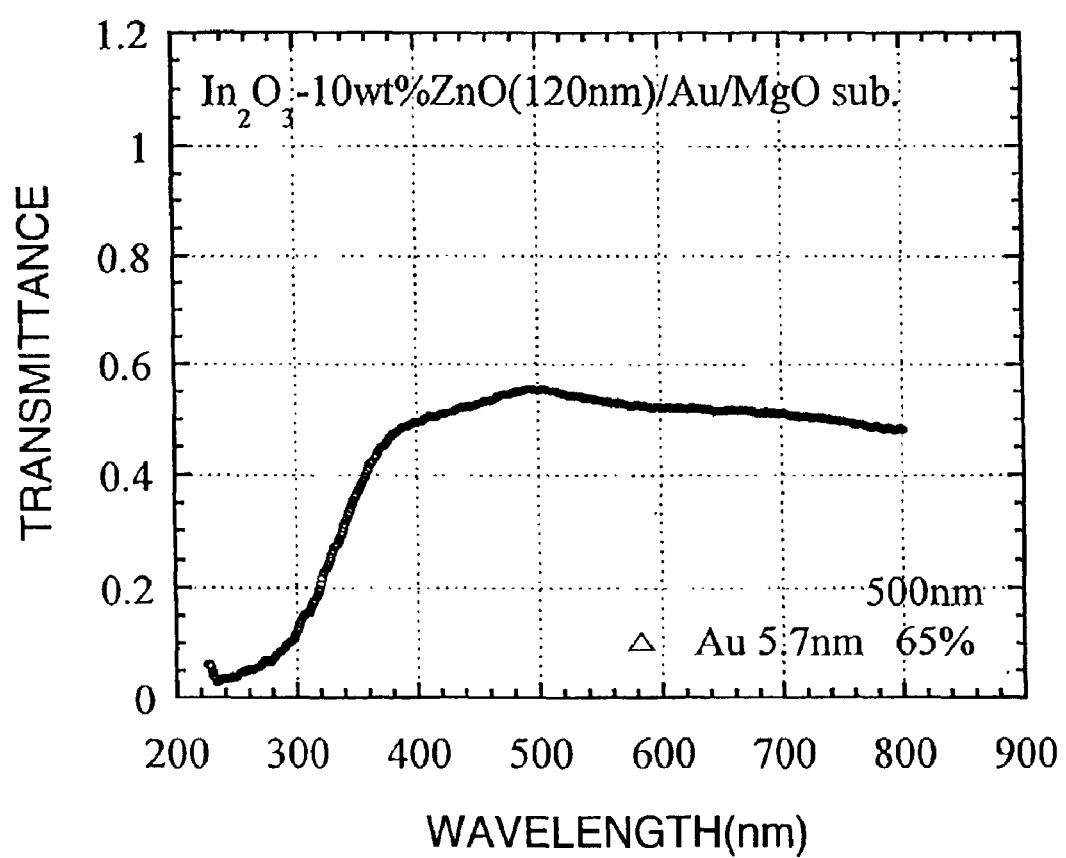
Figure 7C:
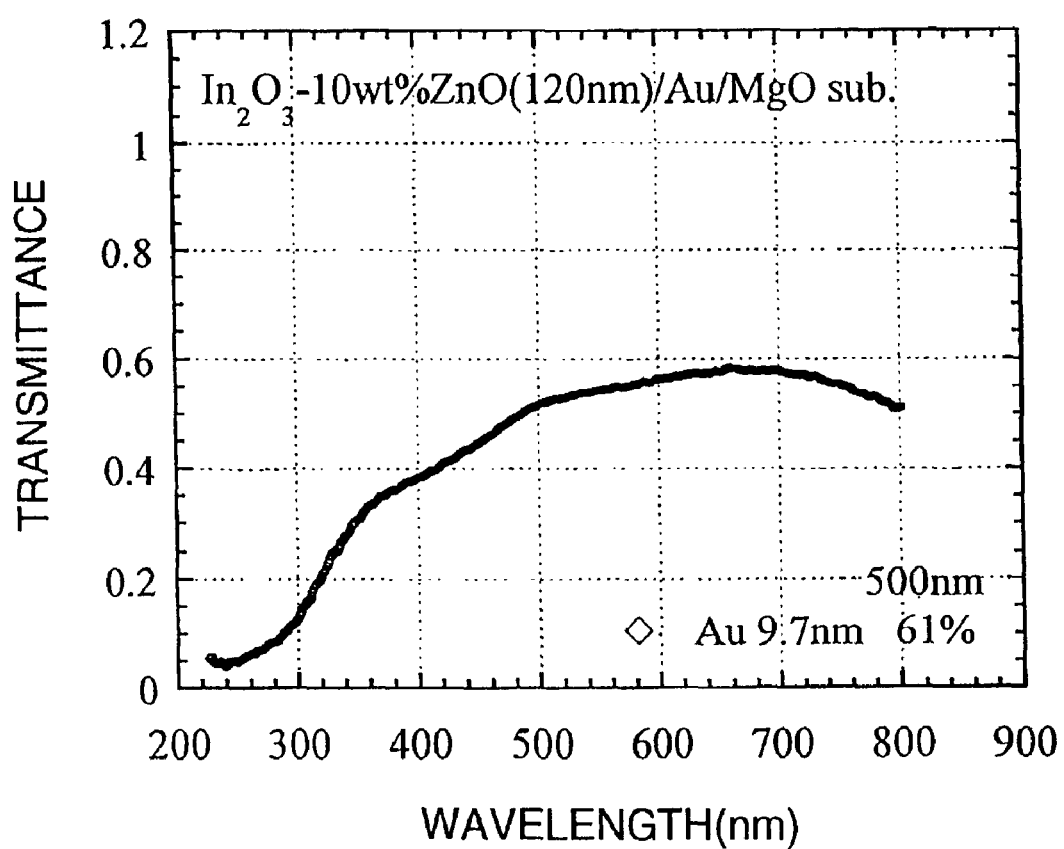
Figure 9B:
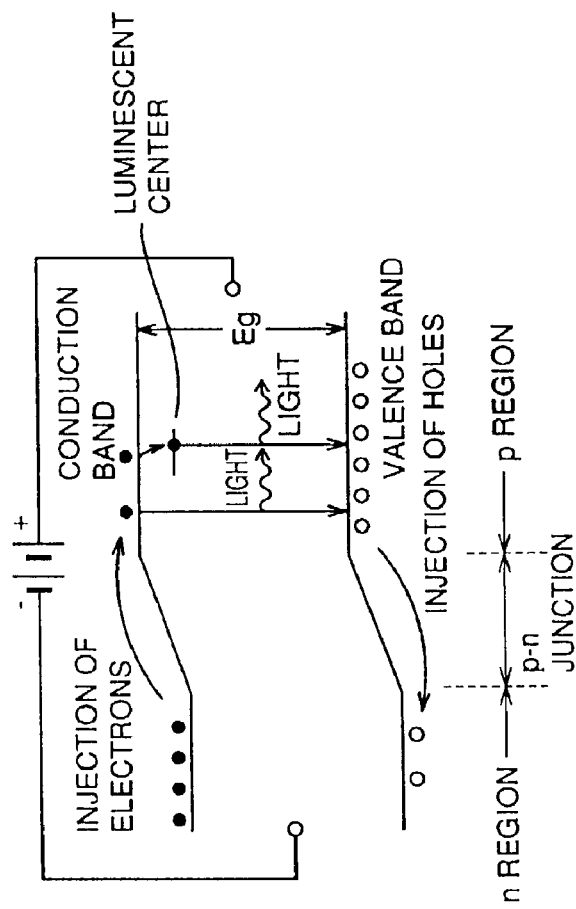
FIGS. 9A and 9B are sectional views of a conventional light-emitting device.
Figure 9A:
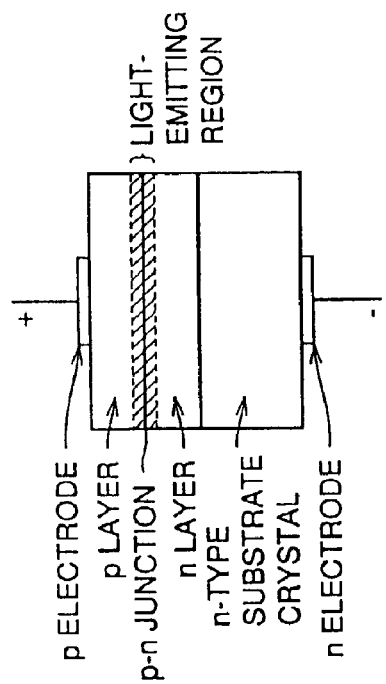
Figure 10:
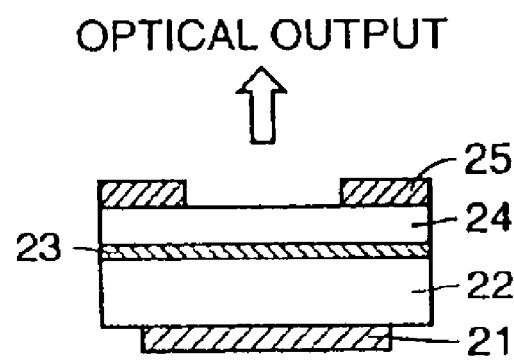
FIG. 10 is a sectional view showing the structure of a conventional LED.
Figure 11:
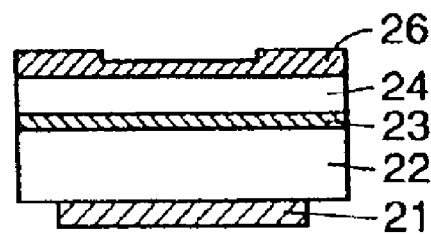
FIG. 11 is a sectional view of a conventional LED having a current diffusion electrode.

FIGS. 7A, 7B and 7C show transmittance in IDIXO/Au electrode structures having three different film thicknesses of the Au film, respectively. Reduction of transmittance resulting from the presence of Au is recognized. At a wavelength of 500 nm, the transmittance of the sample of IDIXO (120 nm)/Au (3 nm) is about 80%. The transmittance was reduced as compared with the small thickness of the Au film conceivably because the transmittance of the IDIXO film itself was reduced due to the presence of Au.

Fourth Embodiment

Figure 8:
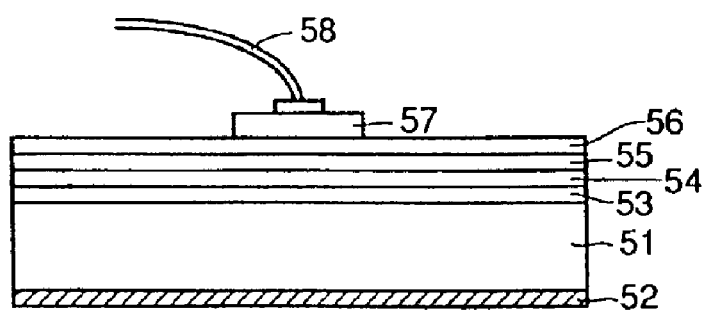
FIG. 8 is a sectional view of a compound semiconductor light-emitting device obtained according to the present invention.

FIG. 8 is a sectional view of a compound semiconductor light-emitting device manufactured with application of the method of manufacturing a transparent conductor film according to the third embodiment of the present invention. Referring to FIG. 8, an n electrode 52 is provided on the back surface of an n-type semiconductor layer 51. An active layer 53 is provided on the n-type semiconductor layer 51. A p-type semiconductor layer 54 is provided on the active layer 53. A contact layer 55 is provided on the p-type semiconductor layer 54. A p electrode 56, which is a transparent electrode, is provided on the contact layer 55. A pad 57 is provided on the p electrode 56. A current is fed to the pad 57 from an external power source (not shown) through a wire 58.

When employing the laser ablation described with reference to the third embodiment as the method of forming the transparent electrode 56 of the compound semiconductor light-emitting device shown in FIG. 8, an electrode having high transmittance, low electrical conductivity and optical output of at least twice that of a conventional Au electrode is obtained. A ZnSe LED preferably has an electrode structure of IDIXO (200 nm)/Au (3 nm), in order to maximize the optical output.

The method of manufacturing a transparent conductor film having the aforementioned structure is not only applied to a method of forming a transparent electrode of a compound semiconductor light-emitting device but also employable in various fields of liquid crystal displays, solar batteries and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a layered structure including a transparent conductor film comprising step of:

forming an Au thin film with a thickness of 1 nm to 3 nm on a semiconductor layer on a light-emitting layer on a substrate;

placing said substrate with said light-emitting layer, said semiconductor layer and said Au thin film thereon in a vacuum chamber;

centering a target containing $In_2O_3$-10 wt. % ZnO serving as the material for a transparent conductor film in said vacuum chamber;

introducing oxygen into said vacuum chamber; and irradiating said target with a laser beam, so as to emit atoms, molecules or ions from said target by ablation, and depositing said atoms, molecules or ions on said Au thin film on said substrate and crystal-growing said atoms, molecules or ions while controlling a film forming temperature in the range from room temperature to 300° C., and setting a film forming pressure of said oxygen in said vacuum chamber at 0.3 to $3\times10^{-3}$ Torr, and thereby oxidizing said atoms, molecules or ions to form said transparent conductor film.

2. A method of manufacturing a compound semiconductor light-emitting device with a light-emitting layer comprising steps of:

preparing a compound semiconductor light-emitting device substrate by forming an Au thin film with a thickness of 1 nm to 3 nm on a semiconductor layer on said light-emitting layer on said device substrate immediately before formation of a transparent electrode;

placing said compound semiconductor light-emitting device substrate with said light-emitting layer, said semiconductor layer and said Au thin film thereon in a vacuum chamber;

centering a target containing $In_2O_3$-10 wt. % ZnO serving as the material for said transparent electrode in said vacuum chamber;

introducing oxygen into said vacuum chamber; and irradiating said target with a laser beam, so as to emit atoms, molecules or ions from said target by ablation, and depositing said atoms, molecules or ions on said Au thin film on said compound semiconductor light-emitting device substrate and crystal-growing said atoms, molecules or ions while setting a film forming temperature in the range from room temperature to 300° C., and setting a film forming pressure of said oxygen in said vacuum chamber at 0.3 to $3\times10^{-3}$ Torr, and thereby oxidizing said atoms, molecules or ions to form said transparent electrode.

* * * * *

UNITED STATES PATENT AND TRADEMARK OFFICE
CERTIFICATE OF CORRECTION

PATENT NO. : 6,872,649 B2
DATED : March 29, 2005
INVENTOR(S) : Takao Nakamura et al.

It is certified that error appears in the above-identified patent and that said Letters Patent is hereby corrected as shown below:

Column 11,
Line 53, after "comprising" replace "step" with -- steps --

Column 12,
Line 11, after "chamber; and" start a new paragraph beginning with "irradiating"

Signed and Sealed this

Twelfth Day of July, 2005

JON W. DUDAS
*Director of the United States Patent and Trademark Office*